United States Patent [19]

Chiba et al.

[11] 4,415,917
[45] Nov. 15, 1983

[54] LEAD FRAME FOR INTEGRATED CIRCUIT DEVICES

[75] Inventors: Hiroshi Chiba; Shoichi Ogura, both of Tokyo, Japan

[73] Assignees: Nippon Electric Co., Ltd.; Sumitomo Metal Mining Company Limited, both of Tokyo, Japan

[21] Appl. No.: 293,130

[22] Filed: Aug. 17, 1981

[30] Foreign Application Priority Data

Aug. 20, 1980 [JP] Japan .................................. 55-114185

[51] Int. Cl.³ ...................... H01L 29/60; H01L 23/48
[52] U.S. Cl. .......................................... 357/70; 357/68; 29/827
[58] Field of Search .................... 357/70, 73, 68, 65; 29/827, 831, 835

[56] References Cited

U.S. PATENT DOCUMENTS

| | | | |
|---|---|---|---|
| 3,781,457 | 12/1973 | McKerreghen | 357/70 X |
| 3,802,069 | 4/1974 | Thompson | 29/827 |
| 4,137,546 | 1/1979 | Frusco | 357/70 |
| 4,138,691 | 2/1979 | Bonkohara et al. | 357/68 X |

FOREIGN PATENT DOCUMENTS 56-50549  5/1981  Japan ................................... 29/827

Primary Examiner—Martin H. Edlow
Assistant Examiner—J. L. Badgett
Attorney, Agent, or Firm—Watson, Cole, Grindle & Watson

[57] ABSTRACT

A lead frame for an IC device includes a body element located at its center, the body element including recesses in its outer periphery in which the inner tips of the leads of the lead frame are fitted at predetermined positions. With such an arrangement, the leads are prevented from being deformed during steps of formation of the IC device.

5 Claims, 6 Drawing Figures

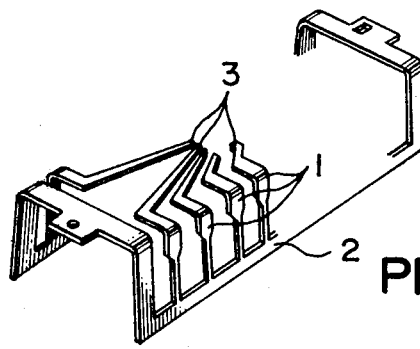
FIG. 1 PRIOR ART
FIG. 2 PRIOR ART
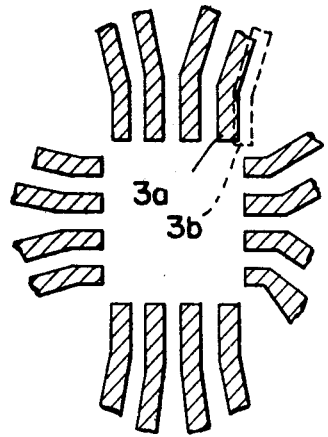
FIG. 3
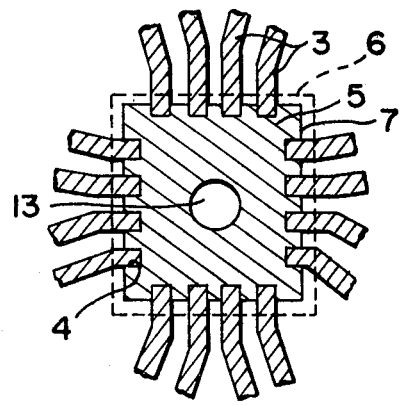
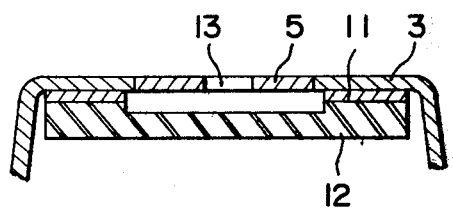
FIG. 4

LEAD FRAME FOR INTEGRATED CIRCUIT DEVICES

BACKGROUND OF THE INVENTION

1. Field of the Invention

The present invention relates to lead frames for integrated circuits, and more particularly to lead frames for glass-encapsulated integrated circuits.

2. Prior Art

Glass-encapsulated integrated circuits are conventionally assembled by stamping a strip of Alloy 42 into a lead frame having a plurality of leads, then attaching the lead frame to a ceramic substrate coated with glass, then fixing an IC (integrated circuit) chip to the assembly, and finally connecting the tips of the inner ends of the leads of the lead frame to electrodes of the IC chip with wires of aluminum, normally by an automatic bonder. It is important that the tips of the inner ends of the leads of the lead frame which is attached to the ceramic substrate be located in predetermined positions. If the tips are displaced out of position due to deformations, the aluminum wires will not be properly bonded to the displaced tips, and the resulting IC device will be useless. As shown in FIG. 1 of the accompanying drawings, an ordinary conventional lead frame has thin leads which extend toward the center of the frame and are supported only at their outer ends, provides a construction which is mechanically weak and susceptible to deformation. The leads can be easily deformed due to residual stresses created when the lead frame is stamped out of a raw material, or else due to rough handling during subsequent assembling operations. At the same time, as more and more electronic functions are performed by IC, the lead frame must have an increased number of leads which are increasingly thinner and longer and which are hence more easily subject to deformations.

One way to reduce such deformations is disclosed in U.S. Pat. No. 4,137,546 to J. M. Frusco. In this patent a lead frame is shown in which the tips of the inner ends of the leads are spaced apart at intervals by separate tabs. However, these tabs cannot perfectly prevent the leads from being deformed. More specifically, when one of the tabs is subjected to an external force, all of the leads that are connected to that tab will be deformed. In addition, the tabs must be broken off by being bent in a subsequent operation which, however, cannot be mechanically performed due to various difficulties.

It is an object of the present invention to provide a lead frame having leads arranged to resist deformation so that aluminum wires can be reliably connected thereto by an automatic bonder.

SUMMARY OF THE INVENTION

According to the present invention, a lead frame for an integrated circuit is constructed to include a body element which has recesses in which are fitted at least two tips at the inner ends of the associated leads.

Further objects, advantages and features of the present invention will become more fully apparent from a detailed consideration of the arrangement and construction of the constituent parts as set forth in the following specification taken together with the accompanying drawings.

BRIEF DESCRIPTION OF THE DRAWINGS

FIG. 1 is a fragmentary perspective view of a conventional lead frame;

FIG. 2 is a fragmentary plan view of a central portion of a conventional lead frame;

FIG. 3 is a fragmentary plan view of a central portion of a lead frame constructed according to the present invention;

FIG. 4 is a cross-sectional view of the lead frame of the present invention as attached to a ceramic substrate.

DETAILED DESCRIPTION OF THE PREFERRED EMBODIMENT

Figure 5:
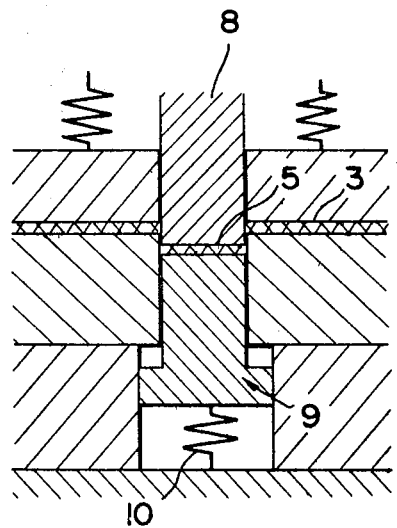
FIGS. 5 and 6 are cross-sectional views illustrative of the way in which a body to be used in the lead frame of the present invention is formed.

A conventional lead frame, as illustrated in FIG. 1, includes support strips 2 which support leads 1 at their outer ends, their inner ends extending inwardly toward the center of the lead frame (due to their being bent at an angle of about 90 degrees at a point along their length). Due to this mode of support, the inner ends of the leads 1 are positionally unstable and susceptible to deformation. As shown in FIG. 2, the inner ends of the leads are normally arranged in a predetermined spatial relation so as to form a space having a generally rectangular contour. When one of the leads is, however, deformed, its inner tip 3a will be displaced, e.g., to a position shown by the broken-line 3b, such that the inner tip will possibly touch an adjacent inner lead tip or else be directed upwardly. In this event, the wires of aluminum cannot be thereafter properly bonded to these tips by an automatic bonder, e.g., the wires as connected may be short-circuited.

According to the present invention, a body element 5 is positioned at the center of the lead frame, the body element 5 including recesses 4 in its outer periphery in which are fitted the respective tips of the inner ends of the leads 1, the recesses 4 being spaced at predetermined intervals or pitches.

It should be noted that lead frames are normally formed by a stamping press having progressive dies, and at an intermediate processing step the lead frames will have a configuration in which the inner lead tips and a centrally positioned body will be integral with each other. However, the inner lead tips and the body have heretofore been cut off along a broken line 6 as shown in FIG. 3 to provide the desired lead frame.

The lead frame of the present invention, on the other hand, can be fabricated by severing the intermediate product along a contour which leaves the extended inner lead tips as shown by the solid line 7 in FIG. 3, thus forming the body element 5 with the recesses 4 in its peripheral sides.

Figure 6:
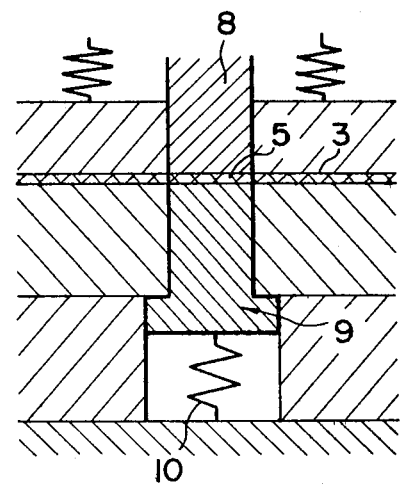

More specifically, as illustrated in FIGS. 5 and 6, the body element 5 is first cut stamped out by an upper die 8 and is then lowered as it is sandwiched between the upper die 8 and a lower die 9. When the upper die 8 is lifted, the severed body 5 is also raised back by the lower die 9 under the force of a spring 10 acting on the lower die into fitting engagement with the inner lead tips 3 to prevent their subsequent displacement. Such raising back of the blanked body element 5 is known as "pushback" in the art of stamping technology. By lightly striking the interfitting portions of the body element wherein the inner lead tips 3 are fitted in the recesses 4, the body element 5 can support the inner lead tips 3 with an increased degree of strength.

The lead frame thus constructed is attached to a ceramic substrate 12 (see FIG. 4) coated with a layer of glass 11, which is melted and solidified to bond the lead frame to the ceramic substrate 12. As the body element 5 and the inner lead tips 3 are held in interfitting engagement with each other, the leads as they are attached to the ceramic substrate 12 will remain positionally and dimensionally the same as when they were stamped out. The body element 5 can be removed from the leads by being pulled out with a suitable tool inserted in a central hole 13 in the body element 5. Thus, the lead frame has positionally stable leads to which aluminum wires can be reliably bonded by an automatic bonder.

The present invention is advantageous in that the inner lead tips can be positioned with a high precision, and hence no positional displacement between the inner lead tips and the aluminum wires will occur while being processed with an automatic bonder. There is no possibility of the leads being deformed between the step of manufacturing the lead frame to the step of attaching the latter to the ceramic substrate. Thus, the lead frame can be handled with ease in such processing steps.

While the present invention has been described with reference to particular embodiments thereof, it will be understood that numerous modifications may be made by those skilled in the art without actually departing from the spirit and scope of the invention as defined in the appended claims.

What is claimed is:

1. A lead frame for an integrated circuit device, said lead frame including support strips; a plurality of leads which have outer ends and inner ends, the outer ends of the leads being connected to the support strips and the inner ends extending toward the center of the lead frame; and a removable body element positioned at the center of the lead frame, the body element including recesses in its outer periphery, in the tips of the inner ends of the leads being positionable in the recesses to prevent their being displaced with respect to one another.

2. A lead frame as claimed in claim 1 wherein the inner ends of the leads extend towards the center of the lead frame to form a generally rectangular space therein, and wherein said body element is generally rectangular in shape.

3. A lead frame as claimed in claim 2 wherein each of the leads is bent at an angle of 90° along its length.

4. A lead frame as claimed in claim 1 wherein the recesses in the outer periphery of the body element are equally spaced apart.

5. A lead frame as claimed in claim 1 wherein the body element includes a central hole to enable it to be removed from its position at the center of the lead frame.

* * * * *